United States Patent [19]

Shenoi

[11] Patent Number: 5,764,704
[45] Date of Patent: Jun. 9, 1998

[54] DSP IMPLEMENTATION OF A CELLULAR BASE STATION RECEIVER

[75] Inventor: Kishan Shenoi, Saratoga, Calif.

[73] Assignee: SymmetriCom, Inc., San Jose, Calif.

[21] Appl. No.: 664,705

[22] Filed: Jun. 17, 1996

[51] Int. Cl.$^6$ .............................. H04L 27/14; H03D 3/00
[52] U.S. Cl. .......................... 375/324; 375/326; 329/327
[58] Field of Search .................................. 375/229, 260, 375/271, 316, 322, 324, 326; 329/315, 327; 455/205

[56] References Cited

U.S. PATENT DOCUMENTS

| | | | |
|---|---|---|---|
| 3,634,773 | 1/1972 | Kobayashi | 329/311 |
| 4,803,739 | 2/1989 | Daikoku | 455/47 |
| 5,177,611 | 1/1993 | Gibsonb et al. | 348/611 |
| 5,434,577 | 7/1995 | Baghdady | 342/380 |

Primary Examiner—Chi H. Pham
Assistant Examiner—Emmanuel Bayard
Attorney, Agent, or Firm—Wilson Sonsini Goodrich & Rosati

[57] ABSTRACT

Demodulating FM signals using digital signal processing extracts a carrier signal from digitized channel signals, multiplies the digital channel signal with this extracted carrier signal, and further filters out the carrier signal to produce the demodulated signal. The DSP technique first down converts a group of channels to baseband which are then processed through an A/D converter to produce a digitized composite signal. A bank of bandpass filters, typically based on FFT processors, applied to the composite signal produce (a group of) digitized channel signal(s). The digitized channel signal is then demodulated by recovering a carrier signal by digitally filtering, for example, using a Hilbert bandpass filter, the channel signal and digitally filtering the product of the carrier signal and the channel signal to recover the modulating voice signals.

15 Claims, 8 Drawing Sheets

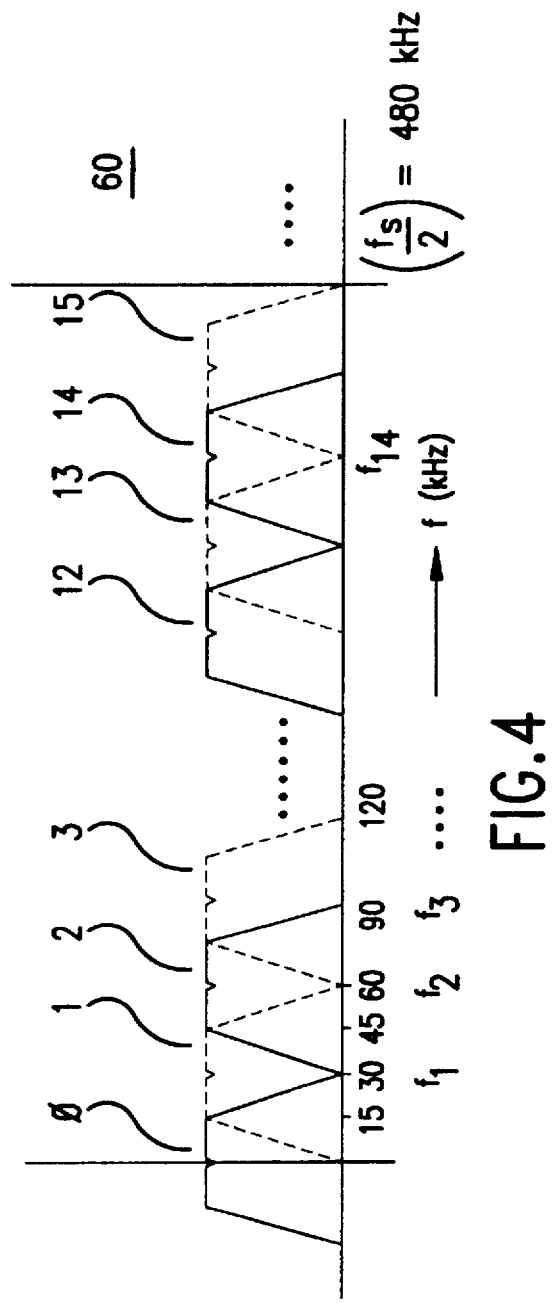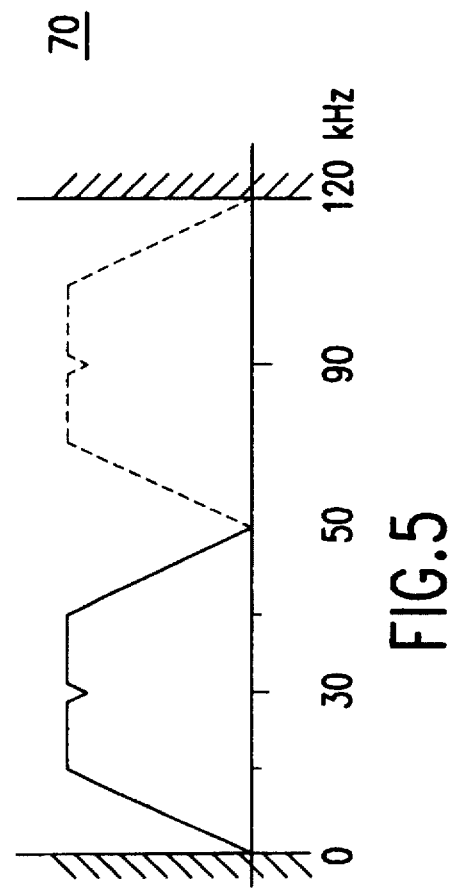

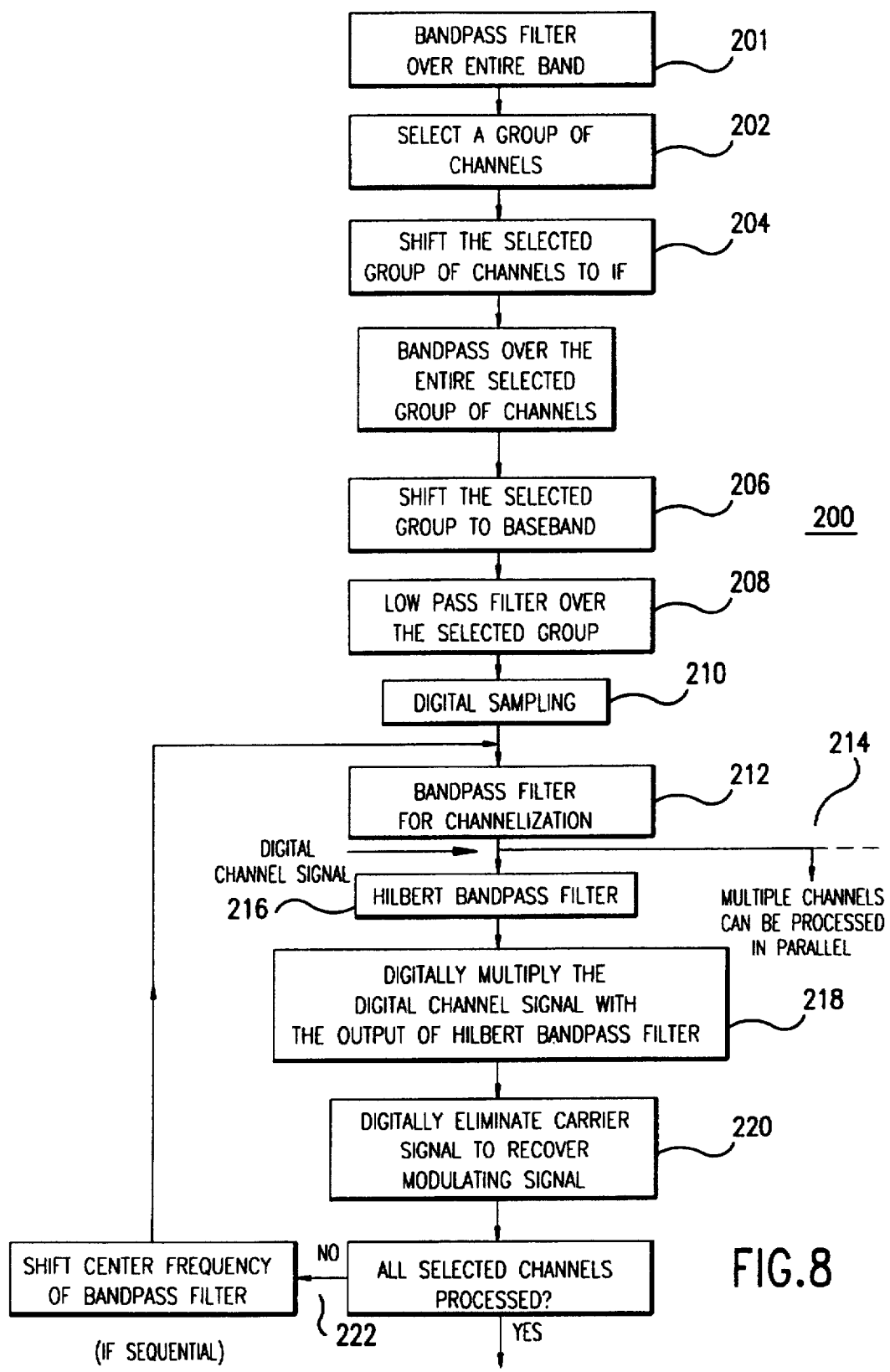

DSP IMPLEMENTATION OF A CELLULAR BASE STATION RECEIVER

BACKGROUND OF THE INVENTION

1. Field of the Invention

This invention relates to the demodulation of signals that are transmitted in cellular radio telephone systems, and more particularly to demodulating FM signals using digital signal processing (DSP).

2. Description of Related Art

Conventional methods for FM demodulation are typically based on analog systems. While analog FM demodulation techniques are inexpensive, they are not generally flexible to accommodate different types of FM demodulation techniques for a variety of different types of signals such as a cellular environment. As in other areas, the use of digital signal processing (DSP) creates the potential for greater flexibility using FM signals, such as in cellular telephony.

In a cellular telephone system, the channel assignments to a given base station is somewhat arbitrary, since any combination of channels can be assigned to any one base station. This causes problems when dealing with demodulation of the received or incoming signal using analog FM demodulation technique, since a typical FM demodulator, which is generally a phase lock loop (PLL) in an analog form, is only responsive to a certain frequency range. The problem arises when there are multiple channels which need to be demodulated. Since the assignment of those channels may be arbitrary to any given base station, a base station has to be designed to handle any possible combination of channels or frequencies. In addition, the channels assigned to a given base station may change over time, based upon various types of studies of the cellular network to accommodate the changes in channel demand. With standard FM techniques, one can use a bank of standard analog PLLs that are tunable across the entire range of FM spectrum. This range is very broad, and thus, implementation of such analog PLLs becomes expensive and complicated. Moreover, analog circuits used for FM demodulation include phase or frequency locked loops and many varieties of discriminator circuits. Generally, analog FM demodulation is not flexible when several channels have to be demodulated, such as in cellular communications, given that the FM signal in a cellular system may be "standard cellular" (AMPS) or narrow band AMPS (NAMPS).

SUMMARY OF THE DISCLOSURE

It is an object of the present invention to provide a digital FM demodulation method and apparatus by extracting a carrier signal, preferably using a digital Hilbert transformation for subcarrier recovery and preferably using a digital AM demodulation with multiplication and integration to extract voice signals.

Rather than using an analog implementation of FM demodulation, one can use a DSP implementation. The DSP implementation of FM demodulation using AM demodulation techniques will provide flexibility, because adaptation to different signals and different frequencies require minimal changes to the device, such as changing certain constants and subroutines in the DSP software. The DSP implementation of an FM demodulation enhances flexibility not available with analog FM demodulation technique. For example, the digital FM demodulation can provide the freedom of easily changing parameters to accommodate various frequencies and can be readily adapted to a cell site to accommodate TDMA, NAMPS, GSM and AMPS techniques.

According to one embodiment of the present invention, a method of demodulating FM signals using digital signal processing (DSP) includes the steps of selecting in the analog domain a band of channels by using a bandpass filter. The band of channels from, for example, a cellular or other wireless network received at the base station are then shifted down to IF. A group of adjacent channels selected from the band from the band of channels are selected from IF and are shifted down to base band, sampled at twice the upper band limitation to shift into the digital domain. Each group of channels is separately processed at base band with a DSP implementation. For example, the channel at the base band is sampled to produce a digital channel signal having in-phase and quadrature components, in which the in-phase component has a carrier component and the quadrature component has the modulating signal (speech) component. Each of the digitally sampled channels is separately processed. Using a narrow frequency bandpass algorithm, such as a Hilbert transform bandpass algorithm, the digital channel signal is filtered to extract the carrier signal. The carrier signal is then multiplied digitally with the digital channel signal to form a mixed signal which contains the modulating signal. Finally, the carrier and higher frequency signals are filtered out to produce only the modulating signal. In the preferred embodiment of the present invention, the Hilbert bandpass filter algorithm has a pass band of less than 600 Hz to extract a carrier component at the center frequency of the filter.

Other features and advantages of the invention will become apparent from the following detailed description, taken in conjunction with the accompanying drawings which illustrate, by way of example, various features of embodiments of the invention.

BRIEF DESCRIPTION OF THE DRAWINGS

A detailed description of embodiments of the invention will be made with reference to the accompanying drawings, wherein like numerals designate corresponding parts in the several figures.

FIG. 4 is a bandpass filter bank for channelization;

FIG. 5 is a per channel frequency domain representation;

FIG. 8 is a flow diagram for demodulating FM signals using digital signal processing.

DETAILED DESCRIPTION OF THE PREFERRED EMBODIMENTS

Figure 1:
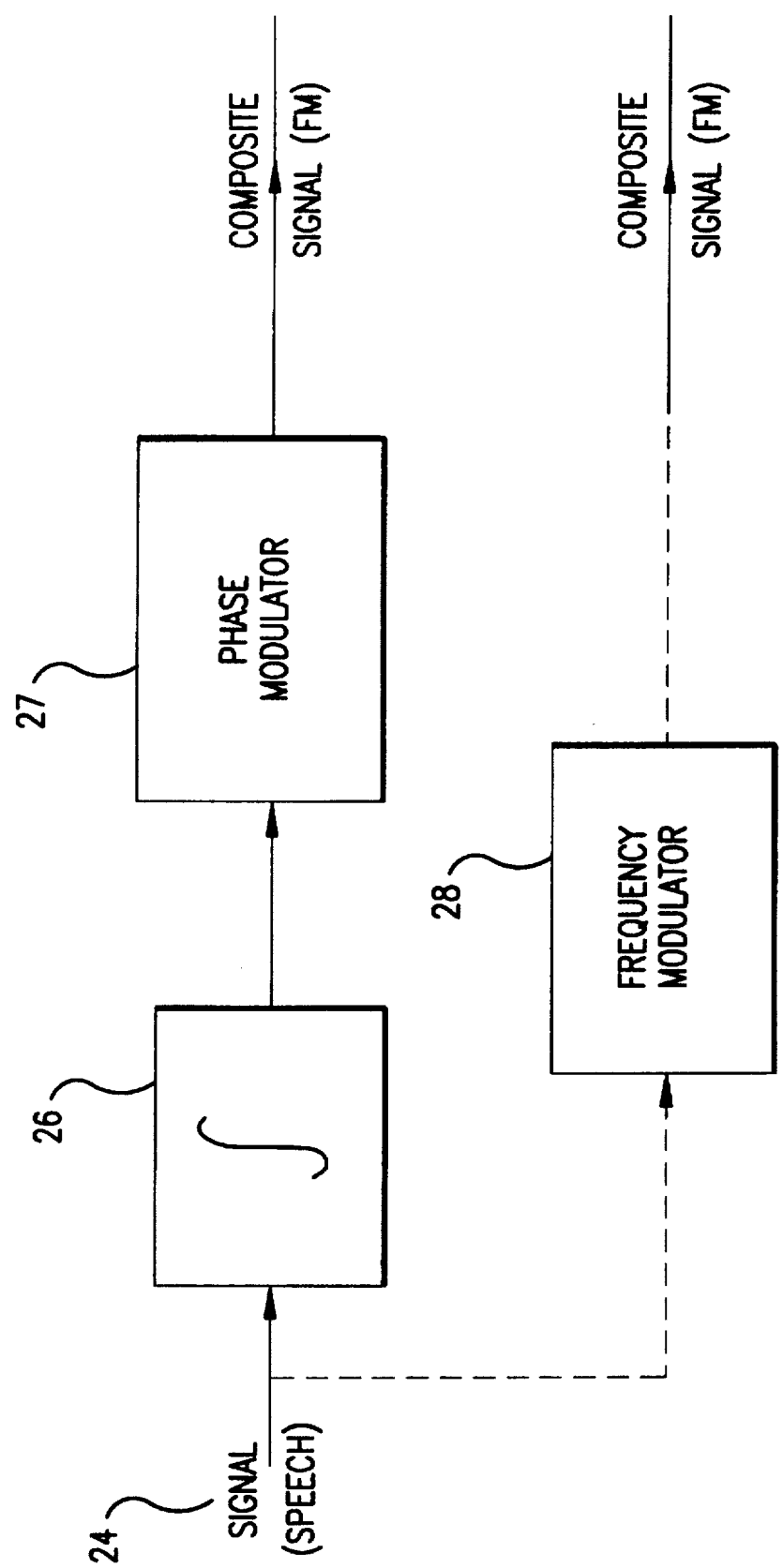
FIG. 1 is a block diagram showing equivalence of phase and frequency modulation.

A method of demodulating FM signals using DSP according to an embodiment of the invention is shown in the drawings for purposes of illustration. In particular, a preferred embodiment of the present invention focuses on the DSP implementation of AMPS/NAMPS/TDMA. Also, as an illustrative example, the following description focuses on the demodulation of a single voice channel which is superimposed on a carrier using a narrow band FM.

Cellular telephone systems in the U.S. operate in the frequency band between 824 MHZ and 894 MHz. The lower portion, between 824 MHz and 849 MHz, is allocated for the "reverse" direction of transmission, from the mobile to the base station. The upper portion, between 869 MHz and 894 MHz, is allocated for the "forward" direction of transmission, from the base station to the mobile. Typically, a nominal channel spacing is 30 KHz, that is, the frequency band is subdivided into "blocks" with a center frequency spacing of 30 KHz and nominal bandwidth of 30 KHz (15 KHz on either side of the center or carrier frequency). Each channel, uses carrier using angle modulation, specifically frequency modulation (FM), with a maximum frequency deviation of 12 KHz. Since the voice channel bandwidth is nominally 3 KHz, the voice channel would thus occupy a bandwidth of 2*(3+12)=30 Khz by applying Carlson's rule. The prescribed frequency allocation permits up to 832 blocks, usually considered as two "bands," A and B, each having a capacity of 416 blocks.

The frequency spectrum is considered to be subdivided in a frequency division multiplex (FDM) manner, with each block referred to as a channel. Each channel represents one telephone conversation. Each mobile unit is assigned a specific carrier frequency for the reverse direction, typically 45 MHz below the carrier frequency used in the forward direction by the base station. Such a scheme is often referred to as "AMPS" (Advanced Mobile Phone Service).

A fundamental principle of cellular telephony is that any geographical area can be subdivided into "cells," with adjacent cells using nonoverlapping frequency blocks. Consequently, each cell, and thus base station, can use only a subset of these 416 channels. This limits the number of simultaneous users in an area served by a base station. To increase the number of subscribers served, other modes of operation have been implemented. The principal idea is to use each channel to serve more than one subscriber. The premise of NAMPS is to subdivide each 30 KHz block into 3 sub-blocks of 10 KHz each and use very narrow band FM for each voice channel. This method increases the number of subscribers that can be served simultaneously by each base station by a factor of 3.

A second approach to increase the number of simultaneous subscribers, again by a factor of 3, is to use the technique of TDMA (Time Division Multiple Access). TDMA presumes that the voice channel is digitized and encoded so as to use approximately 8 kbits/sec for a voice channel. The 30 KHz bandwidth used in cellular telephony can support a modulated digital bit-stream. By imposing a frame structure on this digital bit-stream, multiple subscribers can be accommodated within the block by assigning different "time-slots" to different subscribers. Nominally, each time slot of a full channel transports the signal for one subscriber. By maintaining the FDM hierarchy of 30 KHz blocks, TDMA and analog cellular, such as AMPS, can coexist in the same cell site. Thus, any 30 KHz block can be assigned to digital (TDMA) or to analog transmission.

As shown in FIG. 1, a frequency modulation 28 may be achieved by using a phase modulator 27 with an integrator 26 which integrates the signal 24 prior to phase modulation. The integration is equivalent to a filter providing a 6 dB/octave response, which is the opposite of the preemphasis filter. Thus, by using a phase modulator 27, a preemphasis circuit can be eliminated.

Unlike amplitude modulation (AM), which is considered "linear," angle modulation is inherently nonlinear. This means that in AM, the bandwidth of the modulating signal is preserved. The composite signal is achieved by translating the modulating signal in frequency by an amount equal to the carrier frequency. In angle modulation, the bandwidth is several times that of the modulating signal. Nonetheless, for low modulation indices, the phase modulation may be treated approximately similar to the amplitude modulation for purposes of DSP.

Figure 2:
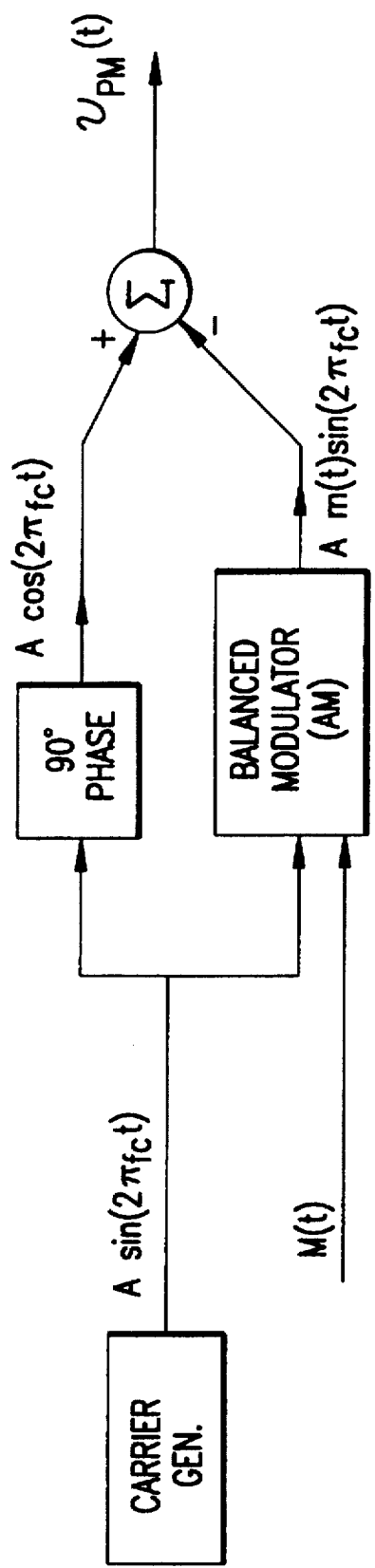
FIG. 2 is a block diagram of Armstrong modulator for narrow band angle modulation (phase modulation)

The above-described relationship between PM and AM is the basis for the Armstrong Modulator, as shown in FIG. 2. Note that the resultant (composite) signal can be viewed as the combination of an AM signal (double sideband suppressed carrier, DSB-SC) to which a carrier component has been added in the quadrature component. In a conventional DSB-AM signal (non suppressed carrier), the additive carrier component is an in-phase component, in which the implied carrier is used to generate the DSB-SC signal. Thus, if a DSB-SC signal is added with an in-phase carrier component, a regular DSB-AM signal is produced. If the additive carrier component is in the quadrature component, the resultant signal is equivalent to a narrow band PM. The above description can be mathematically expressed as follows:

If $|m(t)| \ll 1$ (modulating signal is small), then the composite PM signal, vpm(t), can be expressed as:

$$vpm(t) = A \cos(2\pi f_c t + m(t))$$
$$\cong A \cos(2\pi f_c t) - Am(t) \sin(2\pi f_c t)$$

For conventional demodulators using analog implementations, the processing is done either directly at the carrier frequency or at an intermediate frequency (IF). The processing may include limiting (hard or soft) to minimize any extraneous AM component. The demodulation is implemented using either a PLL (phase lock loop) method or a frequency discriminator method. None of these processors (clipping, PLL, frequency discriminator) is suitable when the channel signal is in a digital form at baseband. Clipping, for example, would generate harmonics which, in an analog implementation, can be filtered out. In a DSP implementation, the clipping has the effect of smearing, introducing inband spurious components via aliasing. Thus, emulating an analog processing is not appropriate in all cases.

Since DSP techniques are applicable in the case of AM, a digital demodulator may be devised by taking the logical inverse of the Armstrong modulator described above. This is an underlying principle of the preferred embodiment of the present invention. All the processes are well suited for implementation in a DSP processor and may be implemented in hardware, firmware or software.

Figure 3A:
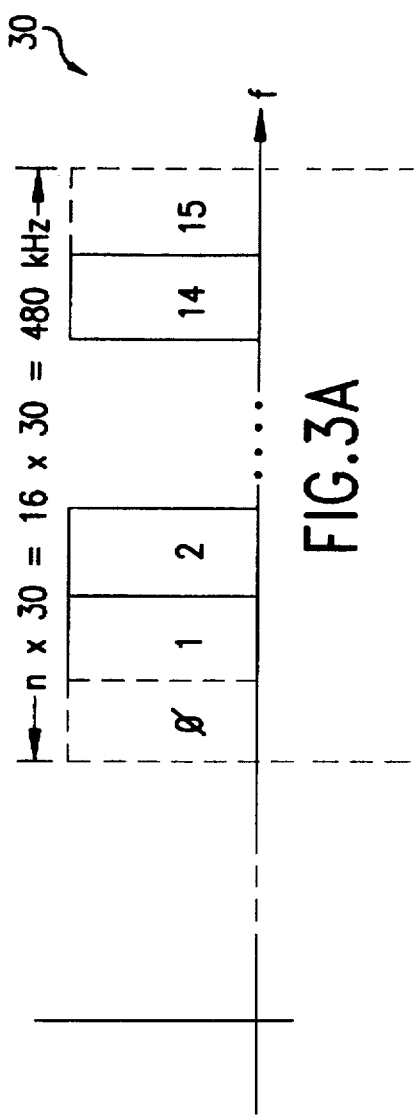
FIGS. 3A–3C show a conversion of group of channels to digital format.
Figure 3B:
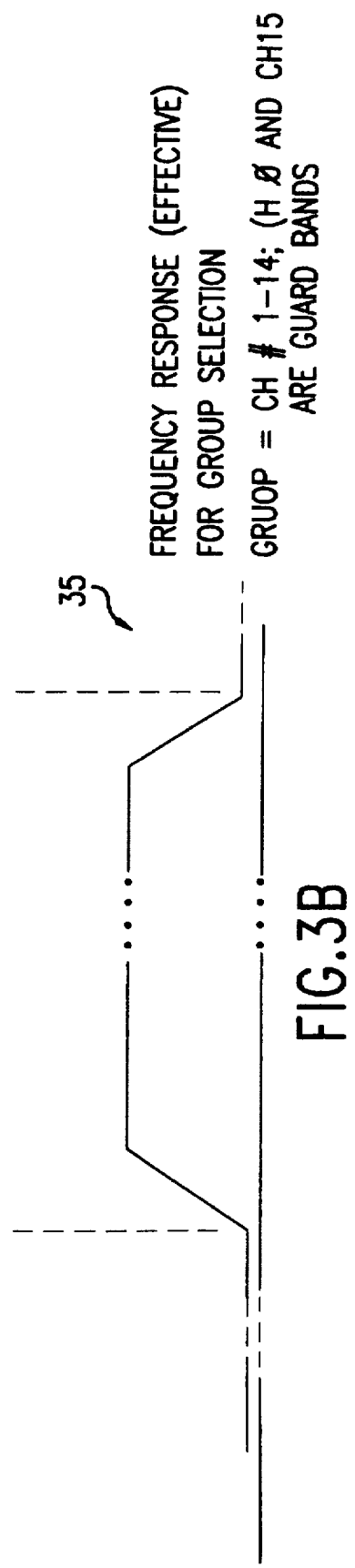
Figure 3C:
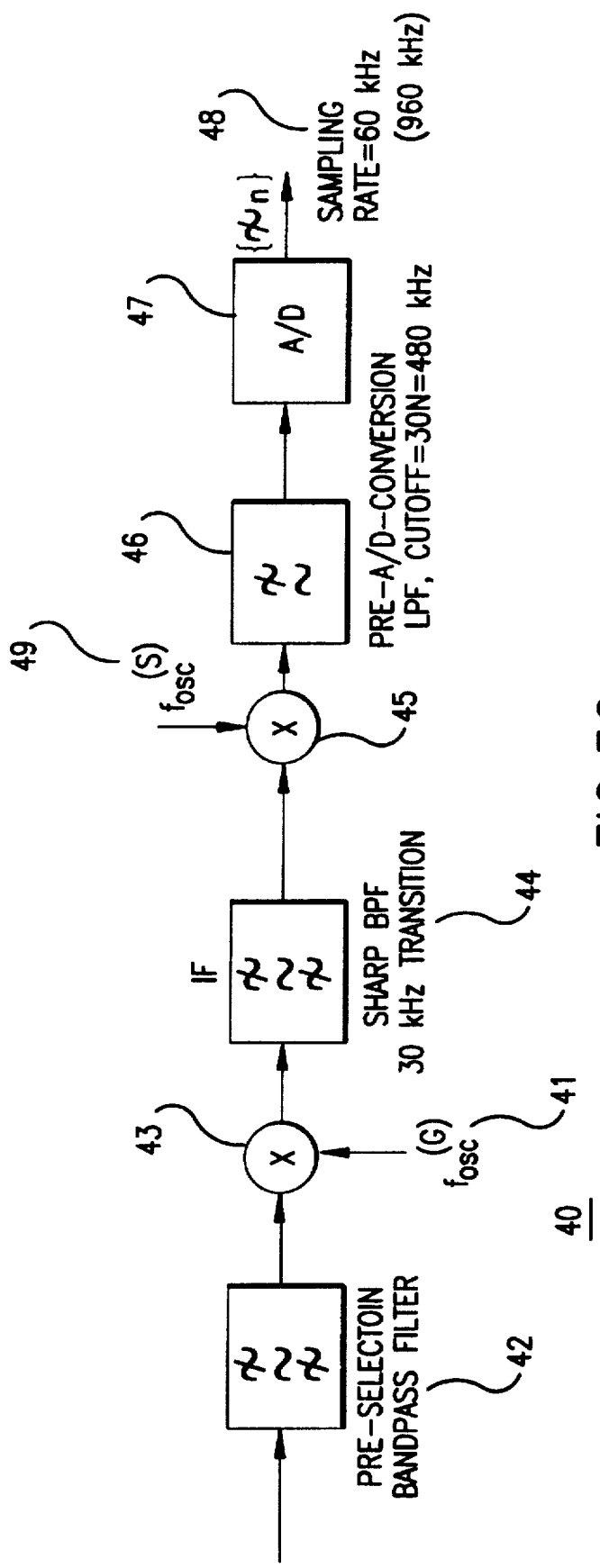

The process of converting a group of channels to digital signals, as a way of example, will now be discussed with regard to FIGS. 3A–3C. The analog front-end circuits choose a group of preferably n FM channels shown in FIG. 4A as fourteen 30 KHz channels plus two guard bands and translate the group down to base band. An FM modulated signal of the n channels is bandpass filtered with a preselected bandpass filter 42 over the entire band, which reduces interference at IF. Next, the group of channels is translated to IF by multiplying the output from the bandpass filter 42 with a first fosc 41. The output from the multiplier 43 is then passed through a sharp bandpass filter 44 which completes the selection of the group of channels. A bandpass filter bandpass filter 44 have the frequency response of FIG. 3B is applied over the entire band of channels 30 of FIG. 3A. The selection of channels 1–14, with a sharp roll off of preferably 6 dB per octave in guard channels 0 and 15, reduces interference. A second multiplier 45 of FIG. 3C multiplies the output from the sharp bandpass filter 44 with a second fosc 49 to translate the group of channels to baseband. The output from the second multiplier 26 is filtered by an anti-aliasing low pass filter 46 before being converted to the analog to digital (A/D) converter 47. The output from the low pass filter 46 has a total of 16 channels from band 0 to band 15, each channel being about 30 KHz wide. As required by the Nyquist's Theory, the A/D converter 47 has a sampling rate of at least which is twice (e.g., 960 KHz) the frequency range of the selected group of channels (e.g., 480 KHz) at the base band. For example, when n=16 (a number of channels selected for DSP), the nominal sampling rate for the A/D converter 47 is 960 KHz. Not shown in FIG. 3C is an automatic gain control (AGC) function performed prior to A/D conversion to maximize the resolution provided by the A/D operation at full range.

Once the selected group of channels are shifted to base band, each channel therein can be processed separately and in parallel. FIG. 4 shows a bandpass filter bank for channelization which is typically based on 32-point DFT (discrete Fourier transformation). The bandpass filter center frequencies, for the purposes of illustration, are 30 n KHz where n=0 to 15. In addition, the filter transition band is 15 KHz on each side of each bandpass filter. The bandpass filter separates the channels which, after undersampling, can be viewed as a single channel stream at a sampling rate of 120 KHz. It is important to recognize that the channel sampling rate, for example, 120 KHz, is twice the Nyquist sampling rate. In the preferred implementation of the bandpass filter bank, with implied undersampling, the channel frequency spectrum to be processed is repositioned, as shown in FIG. 5 by techniques known to those of skill in the art as described in Chapter 7 of digital Signal Processing in Telecommunications (Prentice Hall, 1995) by Kishan Shenoi (which is incorporated herein by reference). The effect of frequency translation and undersampling is to position the carrier frequency of the channel at 30 KHz (nominal), which is one-fourth the sampling frequency. The carrier frequency at baseband (or at the IF frequency used for processing) should be an integer submultiple of the sample rate (e.g. ½, 1/3, 1/4, etc.) so that the processing is easier. By using a higher sampling rate (by about a factor of 2) than the minimum sampling rate, the impact of aliasing is reduced and the complexity of the filters used in the filter bank is reduced as well.

For each channel, the 30 KHz spectrum containing the signal is relatively clean, since there is a 15 KHz guard band on both sides of the signal band to prevent interference components from corrupting the signal band. In a preferred embodiment of the present invention, the bandpass filter bank may be implemented by using a DFT (e.g., an FFT implementation). The output signal of the DFT processing provides in-phase and quadrature components (i.e., complex signals) of each channel. The complex signal is useful in the case of TDMA, since the digital demodulation is simplified when the in-phase and quadrature components are available simultaneously.

Figure 6:
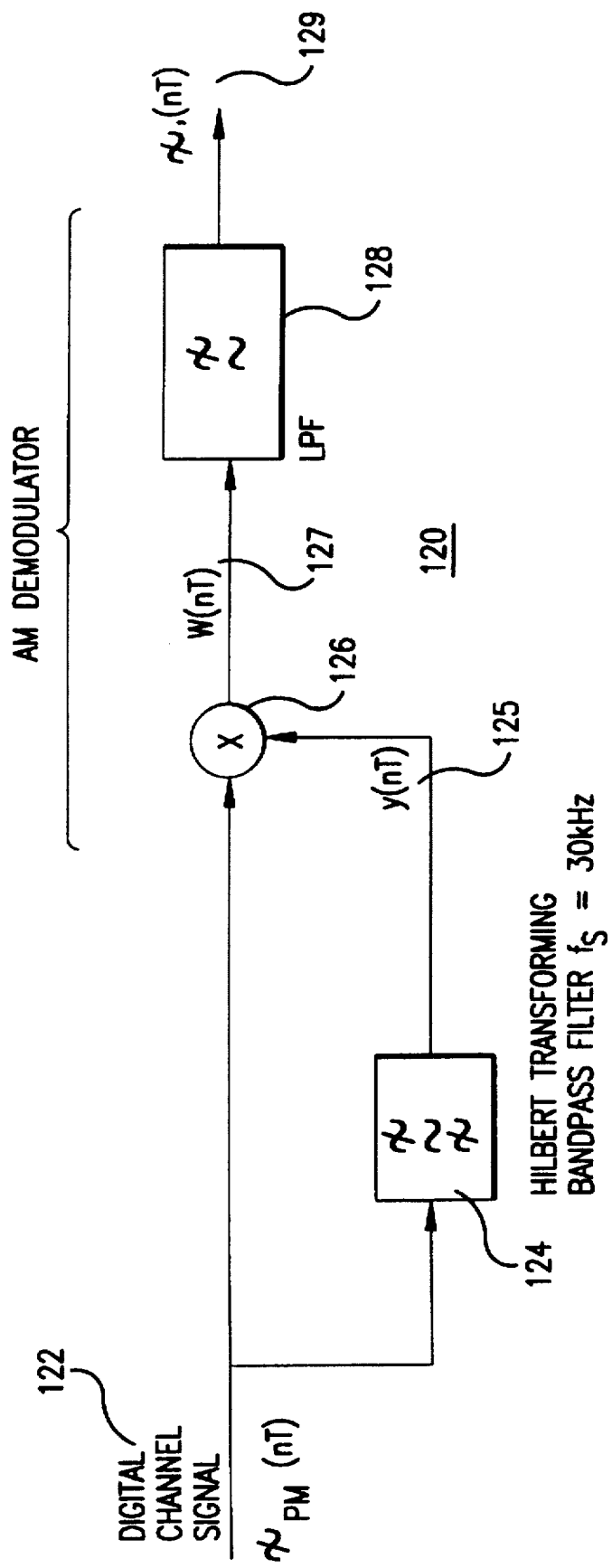
FIG. 6 is a block diagram showing principle of DSP based narrow band angle modulator.
Figure 7:
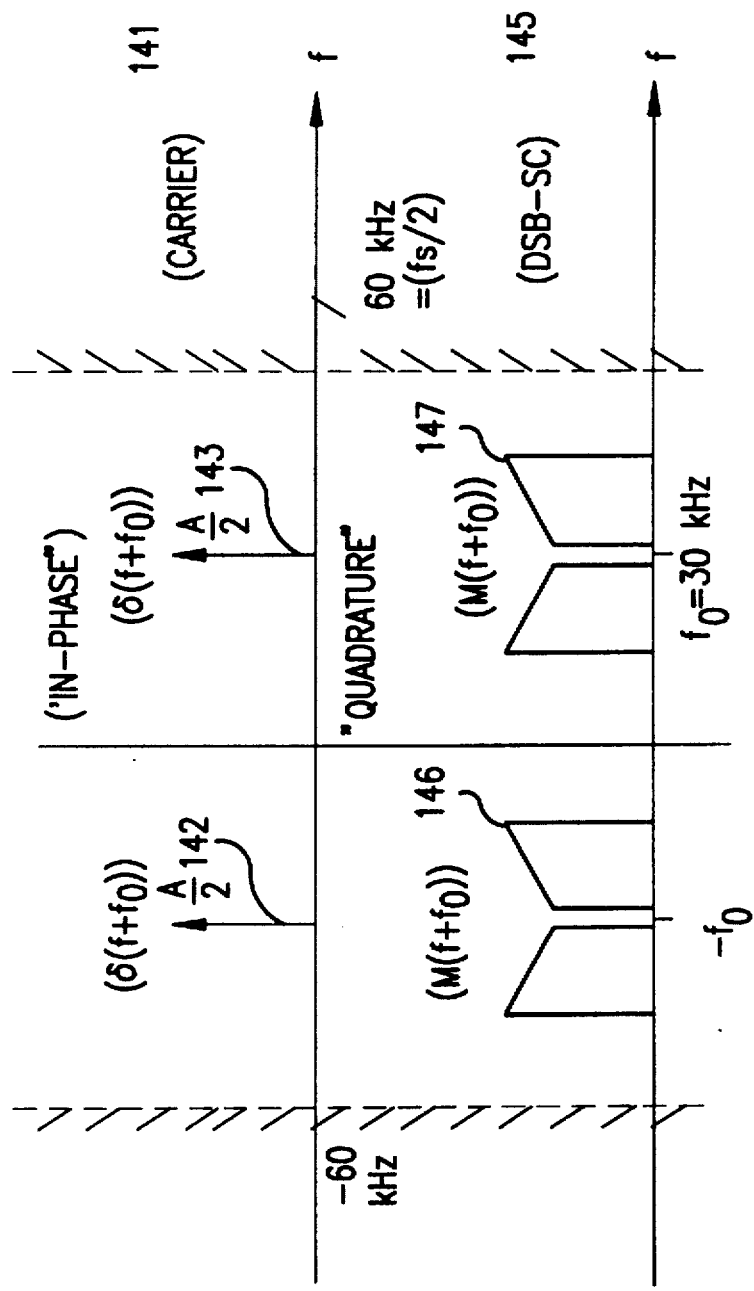
FIG. 7 is a frequency domain representation of a channel signal.

As shown in FIG. 6, the digital channel signal 122 in the time domain is $x_{PM}(nT)$ with the sampling rate of f=120 KHz. The digital channel signal 122 is the composite channel signal obtained from the bandpass filter bank which follows the A/D converter 47 of FIG. 3C. The frequency domain representation of $x_{PM}(nT)$ is $X_{PM}(f)$, and both are mathematically expressed respectively as follows:

$x_{pm}(nT) = A\cos(2\pi f_0 nT) - A\ m(nT)\sin(2\pi f_0 nt)$ $X_{pm}(f) = A/2[\delta(f-f_0)+\delta(f+f_0)]-A/(2j)\ [M(f-f_0)-M(f+f_0)]$ The frequency domain representation of $X_{PM}(f)$ is shown in FIG. 7. A carrier component 141 is represented by impulses 142 and 143 (i.e., delta functions) at +30 KHz and −30 KHz. The signal components 146 and 147 are the quadrature component, as evidenced by the "j" in the above expression, of the composite signal. The signal components 146 and 147 are in an AM signal form, namely, double sideband suppressed carrier (DSB-SC) AM. Since the voice signal has no dc component, a narrow frequency band pass around 30 KHz of the digital channel signal will provide just the carrier component 143.

A Hilbert transform filter 124 commonly used in DSP may be used for filtering to obtain the 30 KHz carrier. The Hilbert transform filter 124 is a digital filter with the frequency response:

---

$G(f) = -jH(f)\text{sgn}(f)$ for $|f| < fs/2$
where $\text{sgn}(f) = 1\ f > 0$
$0\ f = 0$
$-1\ f < 0$

--- and H(f) is a narrowband magnitude response centered at 30 KHz For example, in an FIR (finite impulse response) filter having constrained coefficients to exhibit a negative symmetry (odd function) about the center, the frequency response is guaranteed to be purely imaginary, which corresponds to a 90 degree phase shift. In particular, an odd-length, odd-symmetry filter (N the length of the filter being an odd integer) will have the phase shift of 90 degrees and a flat delay of (N−1)/2 samples. Since N is an odd integer, the flat delay will be an integer number of samples. Further, if N is chosen so that (N−1)/2 is a multiple of 4, an added benefit may be obtained. Since the carrier is nominally 30 KHz, the period of the carrier is 4 samples with a 120 KHz sampling rate. Consequently, if the flat delay is chosen to be a multiple of 4, the phasing at the output of the Hilbert transforming filter 124 will be accurate.

The bandwidth of the Hilbert transform filter 124 (or a processor that implements the Hilbert transform filter) is set to be no more than about 300 Hz wide on each side of a carrier signal. This is because there is no audio signal within 300 Hz of the carrier due to the audio signal filtering in the transmitter. Thus, the total band width of the Hilbert transform filter 124 is preferably less than about 600 Hz. The output from the Hilbert transform filter 124 is a recovered carrier signal for the received digital signal. The carrier signal, which is orthogonal to the digital signal, is then multiplied with the digital signal to further separate the carrier signal from the voice signal.

Portions 126 and 128 of the processing shown in FIG. 6 correspond to a digital implementation of a synchronous demodulator for AM. Conventionally, the difficulty in synchronous AM demodulation (as opposed to common envelope detection) is generation of a local carrier y(nt) that is synchronous in phase and frequency to the carrier used for creating the AM composite signal $x_{pm}(nt)$. However, according to the preferred embodiment of the present invention, by design, it is guaranteed that the "local oscillator" for generating the carrier y(nt) will be substantially of the correct frequency and the correct phase. As discussed above, the carrier signal is obtained by detecting the in-phase component 143 (FIG. 7) of the digital channel signal 122 by using a digital Hilbert transform bandpass filter. The output 129 m(nt) of the demodulator 126 will be a scaled (in amplitude) digital version of the modulation signal m(t) at the transmitter provided that the magnitude of the modulation index used in the modulator (not shown) is substantially less than 1. The software DSP based narrow band angle demodulator 126 multiplies the recovered digital channel signal:

$$X_{pm}(nT)=A\cos(2\pi f_0 nT)-A\ m(nT)\sin(2\pi f_0 nt)$$

by the carrier:

$$y(nT)=A\cos(2\pi f_0 nT+\pi/2)=A\sin(2\pi f_0 nT)$$

yielding a demodulator output:

$$w(nT)=A/2\cos(4\pi f_0 nT)-A^2/2m(nT)[1-\cos(4\pi f_0 nT)]$$

The recovery of the scaled demodulated modulation signal is obtained just by low pass filtering with filter 128:

$$X_1(nT)=A^2/2m(nT)$$

Knowledge of y(nT) 125, the implied carrier, is, therefore, extremely useful. While it is not shown in the figures, this signal may also be used for controlling the AGC (Automatic Gain Control) function for sampling with A/D converter 47 the signal and/or a per-channel AGC function. In particular, the channel signal can be amplified (or attenuated) such that the signal y(nT) 125 has a known prescribed amplitude.

The above-described implementation of DSP is for one channel out of n channels selected at the IF stage. The undersampling in the digital bandpass filter bank ensures that all n channels are alike in that the carrier component is at 30 Khz as described in Chapter VII of Kishan Shenoi's book. Therefore, the same steps can be implemented to demodulate all n Channels. This permits one DSP or a bank of DSP's to perform the base station functions using much of the same software modules.

The DSP FM demodulation technique described above can be summarized using a flow diagram 200 shown in FIG. 8. First, a received FM signal is bandpass filtered 201 over the entire frequency band. A group of channels are selected 202 from the FM signal and are shifted down to IF 204 and then preferably to base band 206. The selected group of channels which are now at base band are low pass filtered 208 to remove any high frequency signals above the upper band limit. The selected group of channels are then sampled at approximately twice its upper limit 210. One channel from the selected group of channels is digitally filtered (channelization) 212 to form a digital channel signal which can be digitally processed to extract a modulating signal. At this point, the process may be done in parallel by additional processors 214 for each of the channels. A carrier signal for the digital channel signal is extracted by performing a digital narrow band bandpass filtering, such as using a Hilbert transform filter algorithm, on the channel signal 216. The recovered carrier signal is then digitally multiplied with the digital channel signal 218 to recover the modulating signal. A digital low pass filter algorithm filters out the shifted carrier signal to recover only the modulating signal 220. If multiple DSP's are not being used for parallel processing (step 214), a single DSP may repeat the process for additional channels in the group 222. The bandpass filter algorithm for the channelization provides all n channels in parallel so that the other channels can be digitally processed to extract a modulating signal in parallel.

While the description above refers to particular embodiments of the present invention, it will be understood that many modifications may be made without departing from the spirit thereof. For example, the disclosed methods of demodulation may be done at IF instead of at the base band frequency. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of digitally demodulating an FM signal at one of an IF and base band frequency created by frequency modulating a carrier signal with a modulating signal, the FM signal having in-phase and quadrature components, wherein the in-phase component has the carrier signal and the quadrature component has the modulating signal, the method comprising the steps of:

sampling the FM signal at an appropriate sample rate to produce a digital channel signal;

digitally filtering the digital channel signal to extract the carrier signal using a narrow frequency bandpass algorithm;

digitally multiplying the carrier signal with the digital channel signal to form a mixed signal which comprises the modulating signal and the carrier signal shifted to a different frequency; and digitally filtering the mixed signal to recover the modulating signal.

2. A method according to claim 1, wherein the narrow frequency bandpass algorithm is a Hilbert bandpass algorithm.

3. A method according to claim 1, wherein the narrow frequency bandpass algorithm has a band pass range of approximately 300 Hz on each side of the carrier signal.

4. A method according to claim 2, wherein the Hilbert bandpass filter has a pass band centered about 30 KHz, the sampling rate chosen such that the baseband FM carrier is at 30 KHz.

5. A method according to claim 2, wherein the Hilbert bandpass filter is an odd-length and odd-symmetry, FIR filter.

6. A method according to claim 2, wherein the Hilbert bandpass algorithm comprises a phase shift of about 90 degrees and a flat delay of (N−1)/2, in which N is an odd integer.

7. A method according to claim 6, wherein the ratio of FM carrier frequency at the one of the IF and baseband to the sample rate, being an integer.

8. A method according to claim 6, wherein (N−1)/2 is a multiple of 4.

9. A method according to claim 1, wherein the filtering of the mixed signal to produce the modulating signal is performed by filtering out high frequency signals.

10. A method according to claim 1, wherein the sampling rate for sampling the FM signal is about twice the upper limit frequency of the FM signal.

11. A method according to claim 1, further comprising the implementation of the steps of claim 1 for other digital channel signals in the FM signal in parallel.

12. A method of digitally demodulating a composite signal, having a plurality of channels, each channel created by frequency modulating a carrier signal with a modulating signal, the FM signal having in-phase and quadrature components, wherein the in-phase component has the carrier component and the quadrature component has the modulating signal, the method comprising the steps of:

shifting a plurality of channels of the FM signal to base band;

sampling the FM band signal at a rate at least twice the bandwidth of the FM band signal to produce a digital channel signal;

digital bandpass filtering to produce a plurality of digital channel signals;

then for each digital channel;

digitally filtering the digital channel signal to extract the carrier signal using a Hilbert bandpass filter algorithm, wherein the Hilbert bandpass filter algorithm has a pass band centered about 30 KHz;

digitally multiplying the carrier component with the digital channel signal to form a mixed signal which comprises the modulating signal and the carrier signal shifted to a different frequency; and digitally filtering the mixed signal to recover the modulating signal.

13. An FM signal demodulating device using digital signal processing (DSP), the device comprising:

means for digitally sampling the FM signal to produce a digital channel signal having in-phase and quadrature components, wherein the in-phase component has a carrier component and the quadrature component has a signal component;

first means for digitally filtering, using a narrow frequency bandpass algorithm, the digital channel signal to extract the carrier signal;

means for digitally multiplying the carrier signal with the digital channel signal to form a mixed signal which comprises a modulating signal and the carrier signal shifted to a different frequency; and second means for digitally filtering the mixed signal to recover the modulating signal.

14. A device according to claim 13, wherein the first digitally filtering means performs Hilbert bandpass algorithm.

15. A method according to claim 7 wherein the delay is an integer multiple of the ratio of the FM carrier to the sample rate.

* * * * *